US012660706B2

(12) United States Patent
Oh et al.

(10) Patent No.: US 12,660,706 B2
(45) Date of Patent: Jun. 16, 2026

(54) SEMICONDUCTOR PACKAGE

(71) Applicant: SAMSUNG ELECTRONICS CO., LTD., Suwon-si (KR)

(72) Inventors: Joo-Young Oh, Suwon-si (KR); Hwan Pil Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 531 days.

(21) Appl. No.: 18/301,374

(22) Filed: Apr. 17, 2023

(65) Prior Publication Data

US 2024/0055405 A1 Feb. 15, 2024

(30) Foreign Application Priority Data

Aug. 11, 2022 (KR) ........................ 10-2022-0100848

(51) Int. Cl.
*H10B 80/00* (2026.01)
*H01L 25/065* (2023.01)
(Continued)

(52) U.S. Cl.
CPC ............ *H10W 90/00* (2026.01); *H10B 80/00* (2023.02); *H10W 42/121* (2026.01); *H10W 74/012* (2026.01); *H10W 74/15* (2026.01); *H10W 72/341* (2026.01); *H10W 72/354* (2026.01); *H10W 90/24* (2026.01); *H10W 90/731* (2026.01); *H10W 90/755* (2026.01)

(58) Field of Classification Search
CPC . H01L 23/562; H01L 21/563; H01L 25/0657; H10W 90/00; H10W 74/15; H10W 74/012
See application file for complete search history.

(56) References Cited

U.S. PATENT DOCUMENTS 8,691,628 B2 4/2014 Tane et al.
9,006,029 B2 4/2015 Katamura et al.
(Continued)

FOREIGN PATENT DOCUMENTS

JP 4910408 B2 4/2012
KR 100817049 B1 3/2008
(Continued)

*Primary Examiner* — Dale E Page
*Assistant Examiner* — Wilner Jean Baptiste
(74) *Attorney, Agent, or Firm* — Wolf, Greenfield & Sacks, P.C.

(57) ABSTRACT

A semiconductor package includes a substrate, a first chip stack on the substrate and including a first semiconductor chip, an underfill pattern on a first side of the first chip stack, and a second chip stack on the first chip stack and including a second semiconductor chip. The second chip stack is stacked so as to be offset to the first chip stack. The first chip stack includes a first adhesive layer under the first semiconductor chip and a first chip protection structure on the first semiconductor chip. The second chip stack includes a second adhesive layer under the second semiconductor chip and a second chip protection structure on the second semiconductor chip. An extension portion of the second adhesive layer is on one side of the first chip protection structure, and the underfill pattern extends from the first side of the first chip stack to the extension portion.

20 Claims, 6 Drawing Sheets

(51) Int. Cl.

| | | |
|---|---|---|
| *H10W 42/00* | (2026.01) |
| *H10W 74/01* | (2026.01) |
| *H10W 74/15* | (2026.01) |
| *H10W 90/00* | (2026.01) |
| H10W 72/30 | (2026.01) |
| H10W 90/24 | (2026.01) |

(56)     References Cited

U.S. PATENT DOCUMENTS

| | | | |
|---|---|---|---|
| 9,159,651 | B2 | 10/2015 | Lee et al. |
| 10,153,179 | B2 | 12/2018 | Lin et al. |
| 10,658,350 | B2 * | 5/2020 | Lee .................... H01L 25/0652 |
| 11,862,603 | B2 * | 1/2024 | Kim .................... H01L 25/0652 |
| 2007/0057410 | A1 | 3/2007 | Chan et al. |
| 2010/0035381 | A1 | 2/2010 | Yoshimura et al. |
| 2016/0050744 | A1 * | 2/2016 | Lee ..................... H05K 1/0206 |
| | | | 361/712 |
| 2019/0035705 | A1 | 1/2019 | Mao |
| 2020/0118940 | A1 | 4/2020 | Vepakomma et al. |
| 2022/0013500 | A1 * | 1/2022 | Baik ................... H01L 23/3135 |

FOREIGN PATENT DOCUMENTS

| | | | |
|---|---|---|---|
| KR | 10-2010-0051337 A | 5/2010 |
| KR | 20120093725 A | 8/2012 |
| KR | 10-2015-0043130 A | 4/2015 |

* cited by examiner 215  210  211        100

110  200a  200        200b  UFE

D2
D1

CR1

211

215        600

255
250  253
251

CS2        210        202

FP
EP 245
240  243
241

CS1        201        300

100

110  200a        231  232  200b  UFE

SEMICONDUCTOR PACKAGE

CROSS-REFERENCE TO RELATED APPLICATIONS

This patent application claims priority under 35 U.S.C. § 119 to Korean Patent Application No. 10-2022-0100848, filed on Aug. 11, 2022, in the Korean Intellectual Property Office, the entire contents of which are hereby incorporated by reference.

BACKGROUND OF THE INVENTION

The inventive concept relates to semiconductor packages, and more particularly, relates to semiconductor packages including a stacked integrated circuit.

A typical stacked package has a structure in which a number of substrates are stacked. For example, the stacked package may include semiconductor chips that are sequentially stacked on a printed circuit board (PCB). Connection pads are formed on the semiconductor chips. Bonding wires may be used to couple the connection pads such that the semiconductor chips are electrically connected to each other. The printed circuit board may be mounted thereon with a logic chip that controls the semiconductor chips.

Recently, portable devices have been increasingly demanded in the electronics market, and thus small and light electronic components mounted in the electronics have been used. A semiconductor package technique of integrating a plurality of individual components in a single package as well as a technique of reducing a size of an individual component may be desirable to realize small and light electronic components. In particular, it may be important for a semiconductor package for processing high-frequency signals to have excellent electrical characteristics as well as a small size.

SUMMARY

An object of the inventive concept is to provide miniaturized semiconductor packages.

An object of the inventive concept is to provide semiconductor packages having improved reliability and stability.

The problem to be solved by the inventive concept is not limited to the above-mentioned problems, and other problems not mentioned will be clearly understood by those of ordinary skill in the art from the following description.

A semiconductor package according to some embodiments of the inventive concept may include a substrate, a first chip stack on the substrate and including a first semiconductor chip, an underfill pattern having opposite first and second sides, wherein the underfill pattern first side is on a first side of the first chip stack, and a second chip stack on the first chip stack and including a second semiconductor chip. The second chip stack may be offset from the first chip stack. The first chip stack may include a first adhesive layer under the first semiconductor chip, and a first chip protection structure on the first semiconductor chip. The second chip stack may include a second adhesive layer under the second semiconductor chip, and a second chip protection structure on the second semiconductor chip. An extension portion of the second adhesive layer may cover a first side of the first chip protection structure, and the underfill pattern may extend from the first side of the first chip stack to the extension portion.

A semiconductor package according to some embodiments of the inventive concept may include a substrate, a first chip stack on the substrate, and a second chip stack on the first chip stack and offset from the first chip stack. The first chip stack may include a first semiconductor chip on the substrate, a first chip protection structure on the first semiconductor chip, and a first adhesive layer under the first semiconductor chip. The second chip stack may include a second semiconductor chip on the first chip stack, a second chip protection structure on the second semiconductor chip, and a second adhesive layer under the second semiconductor chip. The second adhesive layer may include a first film portion extending in a first direction along the second semiconductor chip and a first extension portion extending from the first film portion. The first extension portion is on a first side of the first chip protection structure.

A semiconductor package according to some embodiments of the inventive concept may include a first chip stack on a substrate, the first chip stack including a first semiconductor chip, a first chip protection structure on the first semiconductor chip, a first adhesive layer under the first semiconductor chip, a first chip pad on a first connection region of the first chip protection structure, and a first wire extending from the first chip pad to the substrate. A second chip stack including a second semiconductor chip is on the first chip stack and is offset from the first chip stack. The second chip stack includes a second chip protection structure on the second semiconductor chip, a second adhesive layer under the second semiconductor chip, a second chip pad on a second connection region of the second chip protection structure, and a second wire extending from the second chip pad to the substrate. A plurality of signal pads are on the substrate and spaced apart from the first chip stack. A first one of the plurality of signal pads is connected to the first wire, and a second one of the plurality of signal pads is connected to the second wire. An underfill pattern is adjacent to a first side of the first chip protection structure and vertically overlaps the second chip stack. A molding layer is on the first and second chip stacks, the plurality of signal pads, and the underfill pattern. The underfill pattern includes a first side that is on a first side of the first semiconductor chip, a first side of the first adhesive layer, and an extension portion of the second adhesive layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 6 is a cross-sectional view illustrating a semiconductor package according to the embodiment of FIG. 5.

FIGS. 7 and 8 are cross-sectional views illustrating a semiconductor package according to embodiments of the inventive concept.

DETAILED DESCRIPTION

Figure 1:
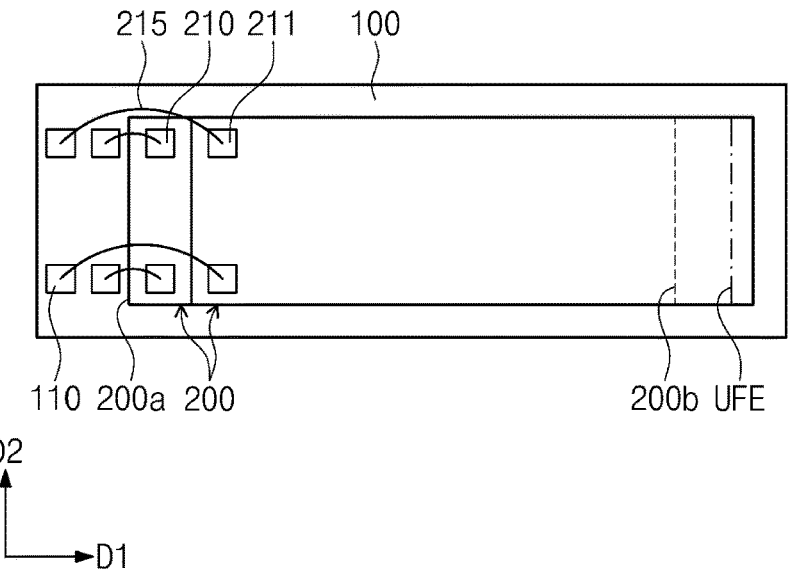
FIG. 1 is a plan view illustrating a semiconductor package according to an embodiment of the inventive concept.

FIG. 1 is a plan view illustrating a semiconductor package according to an embodiment of the inventive concept. FIGS.

Figure 3A:
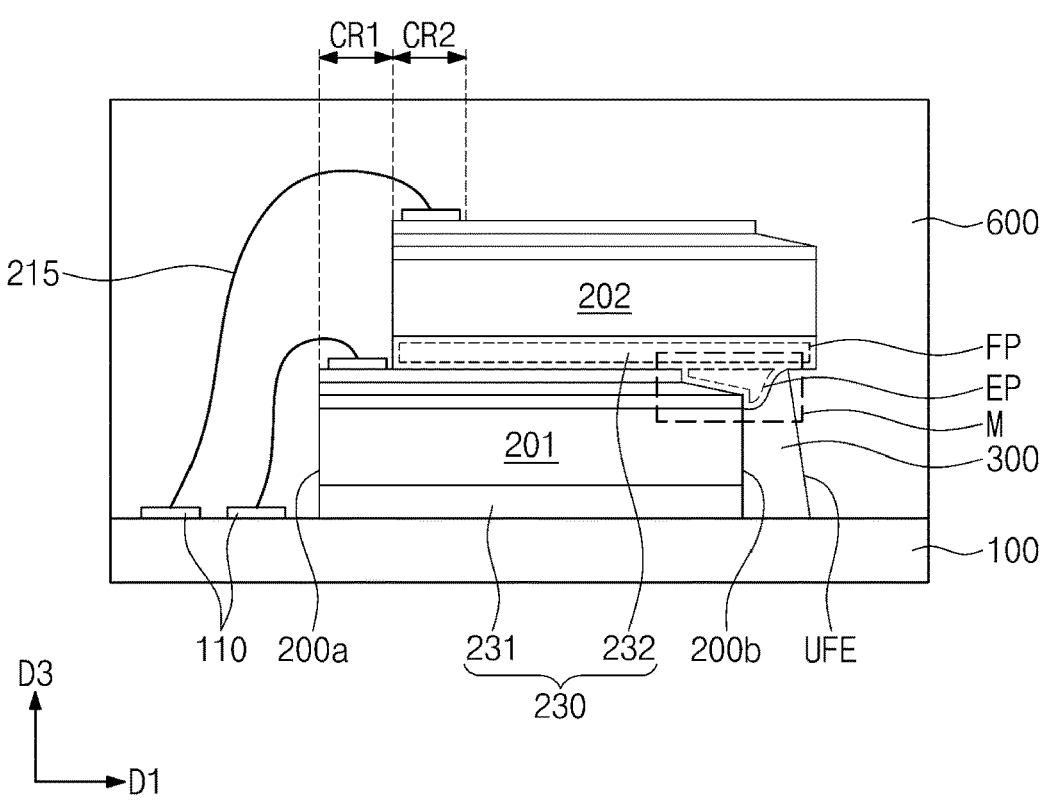
Figure 3B:
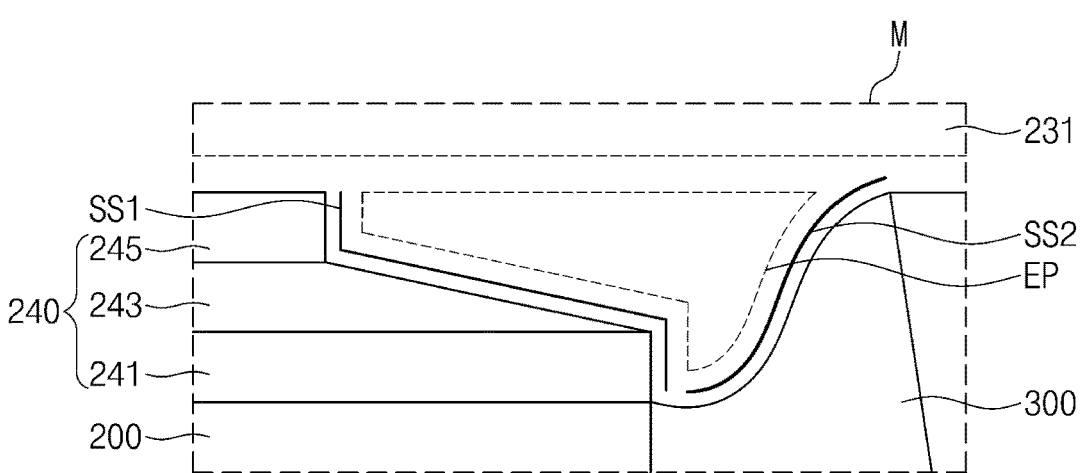
FIG. 3B is an enlarged view illustrating an embodiment of region "M" of FIG. 3A.

2, 3A, and 4 are cross-sectional views illustrating a semiconductor package according to embodiments of the inventive concept. FIG. 3B is an enlarged view illustrating an embodiment of region "M" of FIG. 3A.

Referring to FIGS. 1 to 4, a substrate 100 may be provided. The substrate 100 may be a package substrate. The substrate 100 may be a printed circuit board (PCB) including a signal pattern provided on an upper surface of the substrate 100. The signal pattern may include signal pads 110. The substrate 100 may have a structure in which insulating patterns and wiring patterns are alternately stacked. A plurality of circuit patterns may be disposed inside the substrate 100. External terminals may be provided on a lower surface of the substrate 100. The external terminals may include a solder ball, a solder bump, or a solder pad. Depending on a type of external terminals, the substrate 100 may include a ball grid array (BGA), a fine ball-grid array (FBGA), or a land grid array (LGA) form.

Chip stacks CS1 and CS2 may be stacked on the substrate 100. Each of the chip stacks CS1 and CS2 may include an adhesive layer 230, a semiconductor chip 200, and chip protection structures 240 and 250 sequentially stacked on the substrate 100 in a third direction D3. In the present specification, a first direction D1 and a second direction D2 are defined as directions parallel to an upper surface of the substrate 100 and defined by directions that intersect with each other, and the third direction D3 is perpendicular to the upper surface of the substrate 100.

The adhesive layer 230 may include a die attach film (DAF). The adhesive layer 230 may be a paste-type liquid. The adhesive layer 230 may be a film-type solid state. The adhesive layer 230 may include an epoxy-based polymer. The adhesive layer 230 may adhere between the substrate 100 and the semiconductor chip 200. The adhesive layer 230 may bond the semiconductor chip 200 and the semiconductor chip 200 therebetween.

The semiconductor chip 200 may be a memory chip. For example, the semiconductor chip 200 may be a dynamic random access memory (DRAM) chip, a NAND flash memory, or a logic chip. In the chip stacks CS1 and CS2, the semiconductor chip 200 may be interposed between the adhesive layer 230 and the chip protection structures 240 and 250. That is, the chip protection structures 240 and 250 may be provided on the semiconductor chip 200, and the adhesive layer 230 may be provided under the semiconductor chip 200.

Each chip protection structure 240, 250 may include a respective first passivation layer 241, 251, a respective second passivation layer 243, 253, and a respective third passivation layer 245, 255 sequentially stacked on a respective semiconductor chip 200. A shape of each second passivation layer 243, 253 may be variable depending on a shape of an upper surface of each first passivation layer 241, 251. A shape of each third passivation layer 245, 255 may be variable depending on a shape of an upper surface of each second passivation layer 243, 253.

The first passivation layers 241, 251 may be in a form of a film. The first passivation layers 241, 251 may include silicon nitride. For example, the first passivation layers 241, 251 may include at least one of SiON, SiCN, SiCON, and SiN. The first passivation layers 241, 251 may be deposited through a chemical vapor deposition (CVD), plasma enhanced CVD (PECVD), physical vapor deposition (PVD), or atomic layer deposition (ALD) process.

The second passivation layers 243, 253 may be in a form of a film. The second passivation layers 243, 253 may include silicon oxide. For example, the second passivation layers 243, 253 may include a silicon oxide layer. For example, the second passivation layers 243, 253 may be tetraethylorthosilicate (TEOS) oxide layers. The second passivation layers 243, 253 may be deposited through a chemical vapor deposition (CVD), plasma enhanced CVD (PECVD), physical vapor deposition (PVD), or atomic layer deposition (ALD) process.

The third passivation layers 245, 255 may be in a form of a film. The third passivation layers 245, 255 may include polyimide. For example, the third passivation layers 245, 255 may be photosensitive polyimide (PSPI). The third passivation layers 245, 255 may protect a respective semiconductor chip 200 from an external environment and stress.

Referring back to FIG. 2, a first chip stack CS1 may be provided on the substrate 100. The first chip stack CS1 may include a first adhesive layer 231, a first semiconductor chip 201, and a first chip protection structure 240 that are stacked on the substrate 100 in the third direction D3. The first chip stack CS1 may have a first side 200b and a second side 200a opposite to each other in the first direction D1.

The first adhesive layer 231 may be provided on a upper surface of the substrate 100. That is, the first adhesive layer 231 may include a film portion formed flat along the upper surface of the substrate 100. A thickness of the first adhesive layer 231 may be 5 μm to 30 μm. The first semiconductor chip 201 may be a memory chip. For example, the first semiconductor chip 201 may be a dynamic random access memory (DRAM) chip, a NAND flash memory chip, or a logic chip.

The first chip protection structure 240 may include first to third passivation layers 241, 243, and 245. In detail, the first passivation layer 241 may be provided on the first semiconductor chip 201, and the second passivation layer 243 may be provided on the first passivation layer 241. The third passivation layer 245 may be provided on the second passivation layer 243. A lower surface of the second passivation layer 243 may have the same shape as an upper surface of the first passivation layer 241. One side of the second passivation layer 243 may have an inclined shape. As the one side of the second passivation layer 243 has the inclined shape, an area of the upper surface of the second passivation layer 243 may be smaller than an area of the lower surface of the second passivation layer 243. That is, a width of the second passivation layer 243 in the first direction D1 may become narrower toward the third passivation layer 245. The lower surface of the third passivation layer 245 may have the same shape as the upper surface of the second passivation layer 243.

Figure 2:
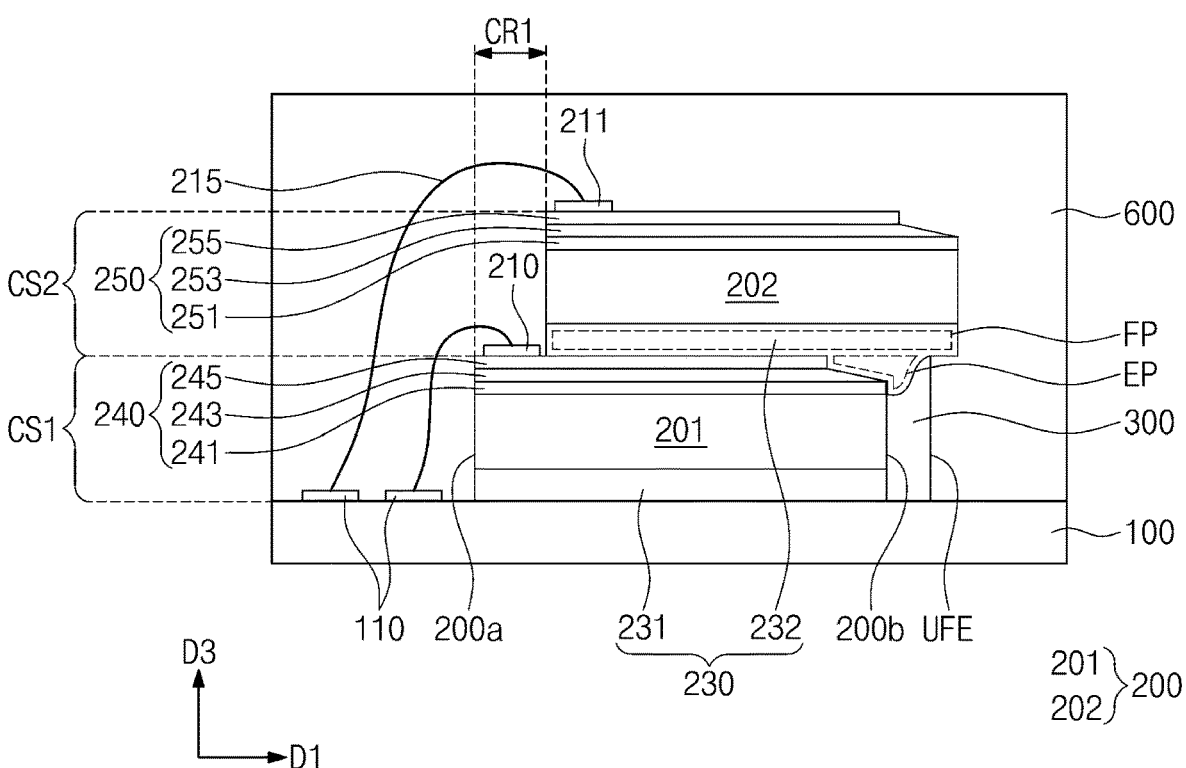
FIGS. 2, 3A, and 4 are cross-sectional views illustrating a semiconductor package according to embodiments of the inventive concept.

The second chip stack CS2 may be provided on the first chip stack CS1. The first and second chip stacks CS1 and CS2 may be offset relative to each other, as illustrated. For example, the second chip stacks CS2 may be stacked at an angle in the first direction D1, and may be in a form of a "stair-step" (i.e., a cascade) inclined upward. As illustrated in FIG. 2, the second chip stack CS2 protrudes in the first direction D1 from the first chip stack CS1, which is positioned under the second stack chip CS2.

As the second chip stack CS2 is stacked in the stair-step configuration, a portion of an upper surface of the first chip stack CS1 may be exposed. That is, a portion of the upper surface of the third passivation layer 245 of the first chip protection structure 240 may be exposed. The exposed portion of the upper surface of the third passivation layer 245 in the first chip stack CS1 is defined as a first connection region CR1. The first connection region CR1 may be positioned adjacent to one side of the first semiconductor chip 201 in an offset stacking direction of the second chip stack CS2. The offset stacking direction is defined as a direction in which the upper stack is shifted with respect to the lower stack among the stacked chip stacks. For example, in FIG. 2, the offset stacking direction of the second chip stack CS2 may be the first direction D1. A first chip pad 210 may be provided on the first connection region CR1. The first chip pad 210 may be connected to an integrated circuit of the first semiconductor chip 200.

The first chip stack CS1 may be wire-bonded on the substrate 100. The first chip stack CS1 may be connected to the substrate 100 through a connection wire 215. For example, a connection wire 215 may connect the first chip pad 210 of the first chip stack CS1 and the signal pad 110 of the substrate 100. The connection wire 215 may include a first end connected to the first chip pad 210, a second end connected to the signal pad 110, and a wire loop connecting the first end and the second end. The signal pad 110 may be spaced apart from the first chip stack CS1 on a plane view.

The connection wire 215 may not be inserted into the adhesive layer 230 of the chip stack. The first chip pad 210 may be horizontally spaced apart from the second chip stack CS2. That is, the first chip pad 210 may not be covered by the second adhesive layer 232 of the second chip stack CS2. As the connection wire 215 is not inserted into the adhesive layer 230, a thickness of the adhesive layer 230 may be reduced regardless of the arrangement, length, and extension direction of the connection wire 215. Accordingly, a thickness of the chip stacks CS1 and CS2 may be reduced, and the semiconductor package may be miniaturized.

The second chip stack CS2 may include a second adhesive layer 232, a second semiconductor chip 202, and a second chip protection structure 250 that are stacked on the first chip stack CS1 in the third direction D3. The second adhesive layer 232 may be provided on an upper surface of the first chip stack CS1. The second adhesive layer 232 may include a film portion FP and an extension portion EP. The film portion FP may be formed flat along the upper surface of the first chip protection structure 240. That is, the film portion FP may cover the upper surface of the first chip protection structure 240 excluding the first connection region CR1. A thickness of the film portion FP of the second adhesive layer 232 may be 5 μm to 30 μm.

Figure 4:
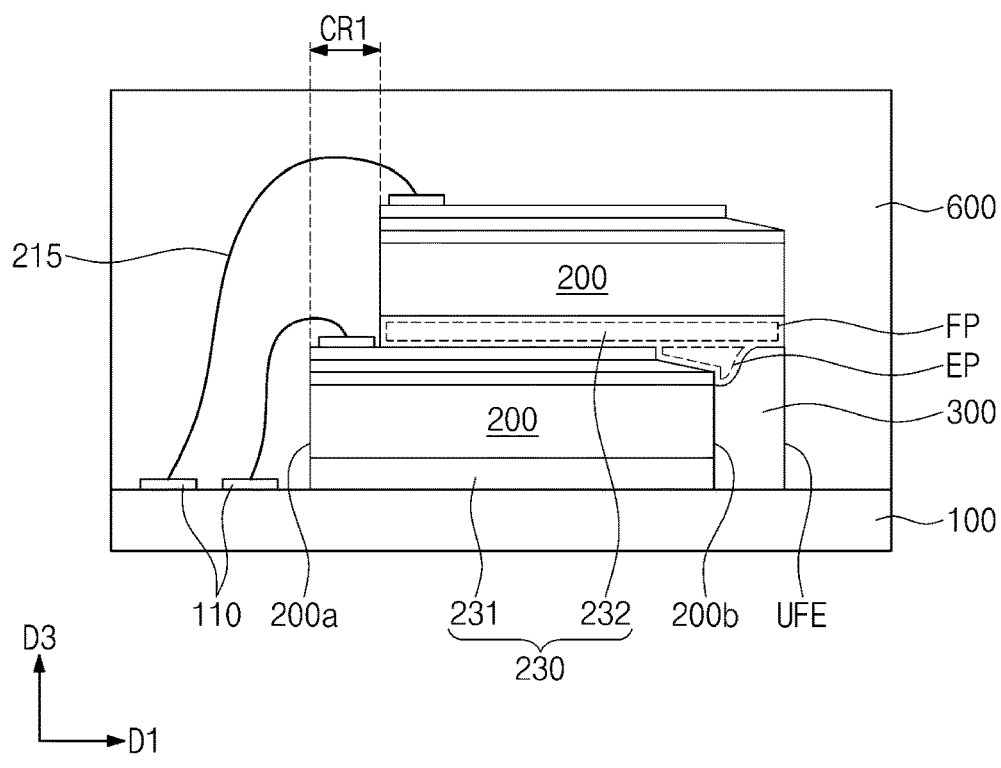

Referring to FIGS. 2 to 4, the extension portion EP of the second adhesive layer 232 may protrude downward from the film portion FP. The extension portion EP may cover one side of the first chip protection structure 240. That is, the extension portion EP may cover one side of the first passivation layer 241, one inclined side of the second passivation layer 243, and one side of the third passivation layer 245. In detail, the one side of each of the first and third passivation layers 241 and 245 may have a slope parallel to the third direction D3. The inclined side of the second passivation layer 243 may have a negative inclination with respect to the third direction D3.

Referring to FIG. 3B, the extension portion EP may have a first side SS1 which is in contact with the one side of the first passivation layer 241, the one inclined side of the second passivation layer 243, and the one side of the third passivation layer 245. The extension portion EP may have a second side SS2 opposite to the first side SS1. The second side SS2 may be defined as a surface in contact with an underfill pattern 300 to be described later. The second side SS2 may have a curved surface. That is, the underfill pattern 300 may cover the second side SS2 of the extension portion EP.

The underfill pattern 300 may be provided on the one side of the first chip stack CS1 and under the second chip stack CS2. The underfill pattern 300 may vertically overlap the extension portion EP and the film portion FP of the second adhesive layer 232. The one side of the first chip stack CS1 may be covered. In detail, the underfill pattern 300 may cover the first adhesive layer 231 and the sides of the first semiconductor chip 201, and may extend from the side of the first semiconductor chip 201 to the extension portion EP.

The underfill pattern 300 may cover the side of the first chip stack CS1 and the extension portion EP of the second adhesive layer 232. In other words, the extension portion EP of the second adhesive layer 232 may cap the first chip protection structure 240, and the underfill pattern 300 may cap the extension portion EP.

As the extension portion EP and the underfill pattern 300 double cap the first chip protection structure 240, the first chip protection structure 240 may be protected from external stress. The external stress may be defined as the sum of stresses (e.g., warpage stress, tensile stress, etc.) applied to the substrate 100 and the second chip stack CS2 by thermal behavior. That is, the extension portion EP of the second adhesive layer 232 and the underfill pattern 300 may protect the first protective layer 241 that is most vulnerable to the external stress among the first chip protective structure 240.

In detail, in a process of manufacturing a semiconductor package, a tension may act in a downward direction on the substrate 100 due to a thermal behavior, and a tension may act on the second chip stack CS2 in an upward direction. As a result, the external stress may be concentrated on the side of the first passivation layer 241 of the first chip protection structure 240. Because an adhesive force between the first semiconductor chip 201 and the first passivation layer 241 is weak, a lateral crack may occur in the first passivation layer 241. The crack phenomenon in a horizontal direction may be defined as an edge peeling phenomenon. As a result, the structure in which the extension portion EP of the second adhesive layer 232 and the underfill pattern 300 double cap the first passivation layer 241 may prevent the edge peeling phenomenon.

The underfill pattern 300 may include a fluxing underfill material or a hybrid underfill material. The fluxing underfill material may include an epoxy material, a reducing agent, a curing agent, a catalyst and an additive. The hybrid underfill material may include solder powder and an epoxy material. The underfill pattern 300 may include an epoxy polymer, phenol, rubber, phenoxy acrylic polymer, colloidal silica, or a combination thereof. The underfill pattern 300 may absorb an external impact or external stress (e.g., tensile stress) instead of the first chip protection structure 240. Accordingly, the first passivation layer 241 of the first chip protection structure 240 may be protected.

Referring to FIG. 2, the underfill pattern 300 may have a first side covering (i.e., on) the first side 200b of the first chip stack CS1 and an opposite second side UFE. The second side UFE may be parallel to the first side 200b of the first chip stack CS1. That is, the second side UFE may be parallel to the third direction D3. A distance from the first side 200b of the first chip stack CS1 to the second side UFE of the underfill pattern 300 may be smaller than a distance from the first side 200b of the first chip stack CS1 to one side of the second chip stack CS2. Referring to FIG. 4, the distance from the first side 200b of the first chip stack CS1 to the second side UFE of the underfill pattern 300 may be same as the distance from the first side 200b of the first chip stack CS1 to one side of the second chip stack CS2. That is, one side of the second chip stack CS2 and the second side UFE of the underfill pattern 300 may be coplanar in a vertical view. Referring to FIG. 3A, the second side UFE of the underfill pattern 300 may be inclined. An inclination of the second side UFE may have a negative inclination with respect to the third direction D3, as illustrated in FIG. 3A.

Referring back to FIG. 2, the second semiconductor chip 202 may be provided on the second adhesive layer 232. The second semiconductor chip 202 may be the same as the first semiconductor chip 201. The second chip protection structure 250 may be provided on the second semiconductor chip 202. The second chip protection structure 250 may include a fourth passivation layer 251, a fifth passivation layer 253, and a sixth passivation layer 255 that are sequentially stacked in the third direction D3. The second chip protection structure 250 may correspond to the first chip protection structure 240. That is, the first passivation layer 241 may be the same as the fourth passivation layer 251. The second passivation layer 243 may be the same as the fifth passivation layer 253. The third passivation layer 245 may be the same as the sixth passivation layer 255.

The second chip stack CS2 may be wire-bonded on the substrate 100. The second chip stack CS2 may be connected to the substrate 100 through the connection wire 215. For example, the connection wire 215 may connect the second chip pad 211 of the second chip stack CS2 and the signal pad 110 of the substrate 100. The connection wire 215 may include a first end connected to the second chip pad 211, a second end connected to the signal pad 110, and a wire loop connecting the first end and the second end.

A molding layer 600 may be provided on the substrate 100. The molding layer 600 may cover the first chip stack CS1, the second chip stack CS2, the signal pads 110, and the underfill pattern 300. The molding layer 600 may include an insulating polymer material such as an epoxy molding compound.

Figure 5:
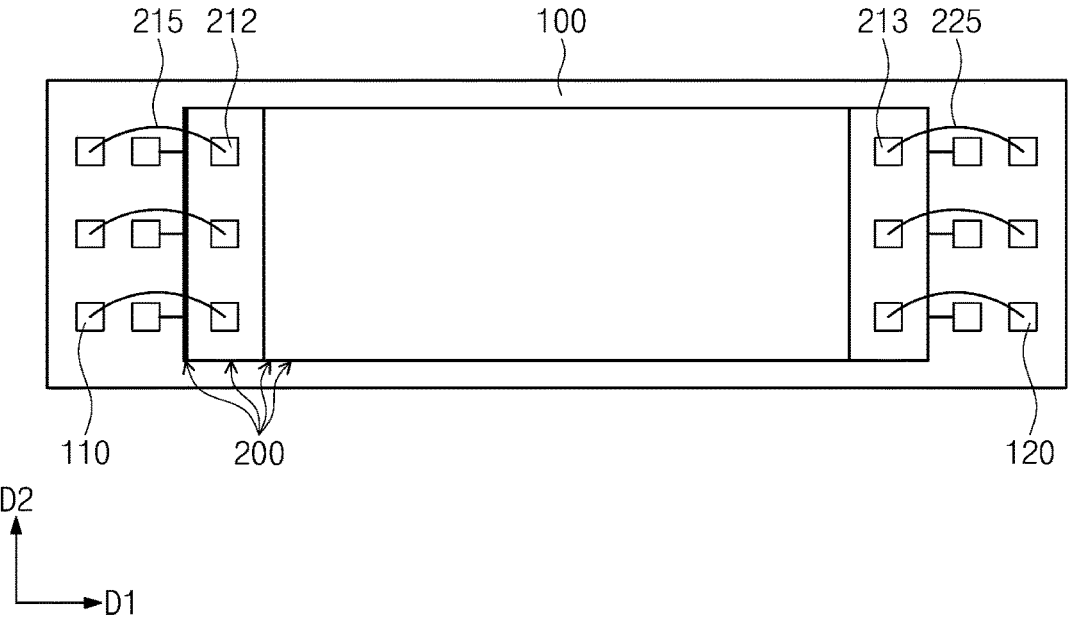
FIG. 5 is a plan view illustrating a semiconductor package according to another embodiment of the inventive concept.
Figure 6:
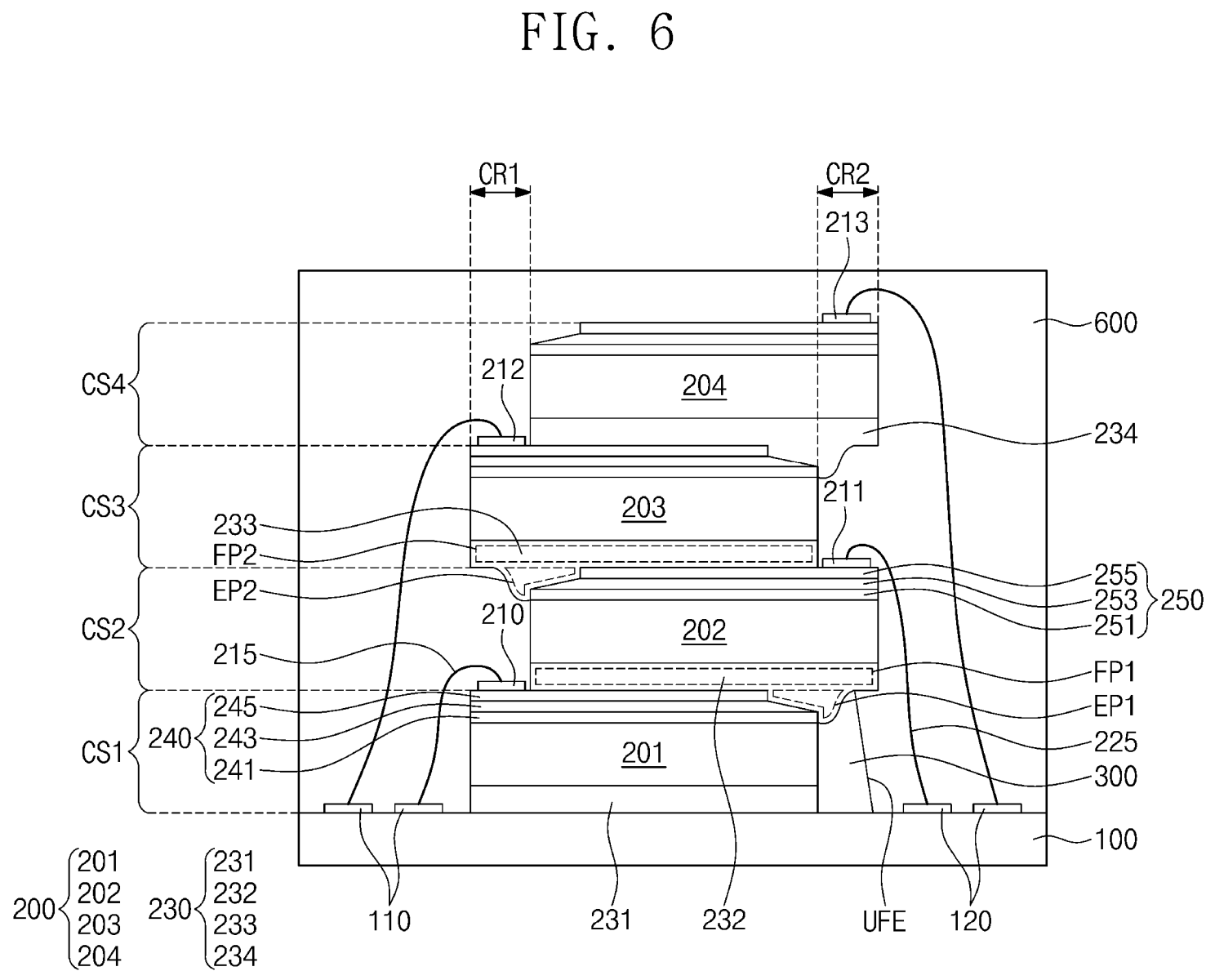

FIG. 5 is a plan view illustrating a semiconductor package according to another embodiment of the inventive concept, and FIG. 6 is a cross-sectional view of FIG. 5. In the present embodiment, detailed descriptions of technical features overlapping with those previously described with reference to FIGS. 1 to 4 will be omitted, and differences will be described in detail.

Referring to FIGS. 5 and 6, a substrate 100 may be provided. A plurality of chip stacks CS1, CS2, CS3, and CS4 may be provided on the substrate 100. The substrate 100 may include a signal pattern provided on an upper surface of the substrate 100. The signal pattern may include signal pads 110 and 120. The signal pads 110 and 120 may be horizontally spaced apart from the first chip stack. The first signal pads 110 may be provided to be horizontally spaced apart from each other on one side of the first chip stack. The second signal pads 120 may be provided to be horizontally spaced apart from each other on the other side of the first chip stack.

The chip stacks CS1, CS2, CS3, and CS4 may be stacked on the substrate 100. Each of the chip stacks CS1, CS2, CS3, and CS4 may include an adhesive layer 230, a semiconductor chip 200, and chip protection structures 240 and 250 sequentially stacked in the third direction D3, as illustrated. The semiconductor chip 200 may be a first semiconductor chip 201, a second semiconductor chip 202, a third semiconductor chip 203, and a fourth semiconductor chip 204 in the chip stacks CS1, CS2, CS3, and CS4, respectively. The second chip stack CS2 may include a second adhesive layer 232, the second semiconductor chip 202, and a second chip protection structure 250. The second adhesive layer 232 may include a first film portion FP1 and a first extension portion EP1. The first film portion FP1 may correspond to the film portion FP of FIG. 2, and the first extension portion EP may correspond to the extension portion EP of FIG. 2. That is, the first film portion FP1 may be the same as the film portion FP of FIG. 2, and the first extension portion EP1 may be the same as the extension portion EP of FIG. 2.

The third chip stack CS3 may be provided on the second chip stack CS2. The second and third chip stacks CS2 and CS3 may be offset relative to each other, as illustrated. For example, the third chip stack CS3 may be stacked on the second chip stack CS2 and offset along the first direction D1, which may form a stair-step configuration (i.e., a cascade) inclined upward. In detail, the third chip stack CS3 may protrude in the first direction D1 from the second chip stack CS2 positioned under the second chip stack SC2. A direction in which the third chip stack CS3 protrudes may be opposite to a direction in which the second chip stack CS2 protrudes from the first chip stack CS1. That is, the third chip stack CS3 may vertically overlap the first chip stack CS1, as illustrated.

As the third chip stack CS3 is stacked in a stair-step configuration, a portion of an upper surface of the second chip stack CS2 may be exposed. That is, a portion of an upper surface of a sixth passivation layer 255 of the second chip protection structure 250 may be exposed. The exposed portion of the upper surface of the sixth passivation layer 255 in the second chip stack CS2 is defined as a second connection region CR2. The second connection region CR2 may be positioned adjacent to one side of the second semiconductor chip 202 in the offset stacking direction of the third chip stack CS3. A second chip pad 211 may be provided on the second connection region CR2. The second chip pad 211 may be connected to an integrated circuit of the second semiconductor chip 202.

The third chip stack CS3 may include a third adhesive layer 233, the third semiconductor chip 203, and a third chip protection structure that are stacked on the second chip stack CS2 in the third direction D3. The third adhesive layer 233 may be provided on the upper surface of the second chip stack CS2. The third adhesive layer 233 may include a second film portion FP2 and a second extension portion EP2. The second film portion FP2 may be formed flat along an upper surface of the second chip protection structure 250. That is, the second film portion FP2 may cover the upper surface of the second chip protection structure 250 excluding the second connection region CR2. A thickness of the second film portion FP2 of the third adhesive layer 233 may be 5 μm to 30 μm.

The second extension portion EP2 of the third adhesive layer 233 may protrude downward from the second film portion FP2. The second extension portion EP2 may cover one side of the second chip protection structure 250. That is, the second extension portion EP2 may cover one side of the fourth passivation layer 251, one inclined side of the fifth passivation layer 253, and one side of the sixth passivation layer 255, as illustrated in FIG. 6. In detail, the first side of each of the fourth and sixth passivation layers 251 and 255 may have a slope parallel to the third direction D3 (i.e., the side surfaces of the fourth passivation layer 251 and the sixth passivation layer 255 are parallel to each other and to the third direction D3). The first side of the fifth passivation layer 253 may have a positive inclination or angle with respect to the third direction D3, as illustrated. The second extension portion EP2 may cap (i.e., contact and/or cover) the first side of the fourth passivation layer 251, the inclined first side of the fifth passivation layer 253, and the first side of the sixth passivation layer 255. The second extension portion EP2 may be symmetrical with the first extension portion EP1.

The third chip protection structure may correspond to the first chip protection structure 240 of FIG. 2. That is, the third chip protection structure may include the same passivation layers as the first to third passivation layers 241, 243, and 245 constituting the first chip protection structure 240 of FIG. 2. In addition, the third chip protection structure may have the same structure as the first chip protection structure 240 of FIG. 2.

The fourth chip stack CS4 may be provided on the third chip stack CS3. The third and fourth chip stacks CS3 and CS4 may be provided in an offset stacking configuration. For example, the fourth chip stack CS4 may be stacked on the third chip stack CS3 and offset along the first direction D1, which may form a stair-step configuration (i.e., a cascade) inclined upward. In detail, the fourth chip stack CS4 may protrude in the first direction D1 from the third chip stack CS3 positioned under the third chip stack CS3. A direction in which the fourth chip stack CS4 protrudes may be opposite to a direction in which the third chip stack CS3 protrudes from the second chip stack CS2. That is, the fourth chip stack CS4 may vertically overlap the second chip stack CS2.

The fourth chip stack CS4 may include a fourth adhesive layer 234, the fourth semiconductor chip 204, and a fourth chip protection structure that are stacked on the third chip stack CS3 in the third direction D3. The fourth adhesive layer 234 may correspond to the second adhesive layer 232. That is, the fourth adhesive layer 234 may have the same structure as the first film portion FP1 and the first extension portion EP1 of the second adhesive layer 232. The fourth chip protection structure may correspond to the second chip protection structure 250. That is, the fourth chip protection structure may include the same passivation layers as the fourth to sixth passivation layers 251, 253, and 255 constituting the second chip protection structure 250. Also, the fourth chip protection structure may have the same structure as the second chip protection structure 250.

The first to fourth chip stacks CS1, CS2, CS3, and CS4 may be wire-bonded on the substrate 100. The first and third chip stacks CS1 and CS3 may be connected to the substrate 100 through first connection wires 215. For example, the first connection wire 215 may connect the first chip pad 210 of the first chip stack CS1 and the first signal pad 110 of the substrate 100. The first connection wire 215 may connect the third chip pad 212 of the third chip stack CS3 and the first signal pad 110 of the substrate 100. The first connection wires 215 may include a first end connected to the first and third chip pads 210 and 212, a second end connected to the first signal pad 110, and a wire loop connecting the first end and the second end. The first signal pads 110 may be spaced apart from the first chip stack CS1 on a plane view.

The second and fourth chip stacks CS2 and CS4 may be connected to the substrate 100 through second connection wires 225. For example, the second connection wire 225 may connect the second chip pad 211 of the second chip stack CS2 and the second signal pad 120 of the substrate 100. The second connection wire 225 may connect the fourth chip pad 213 of the fourth chip stack CS4 and the second signal pad 120 of the substrate 100. Each of the second connection wires 225 may include a third end connected to the second and fourth chip pads 211 and 213, a fourth end connected to the second signal pad 120, and a wire loop connecting the third end and the fourth end. The second signal pads 120 may be spaced apart from the first chip stack CS1 on a plane view. The second signal pads 120 may be provided opposite the first signal pads 110 with respect to the first chip stack CS1.

Figure 7:
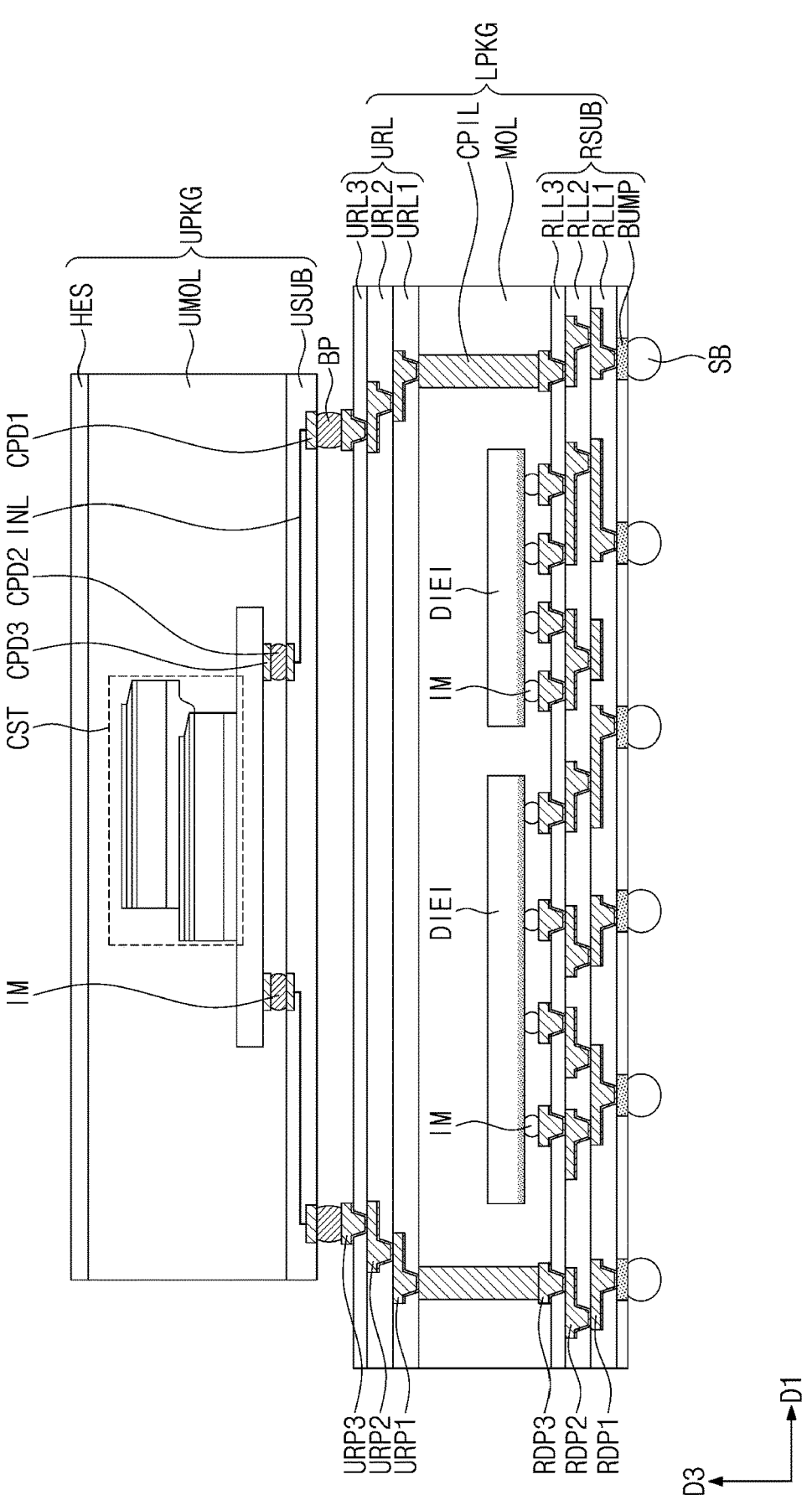
Figure 8:
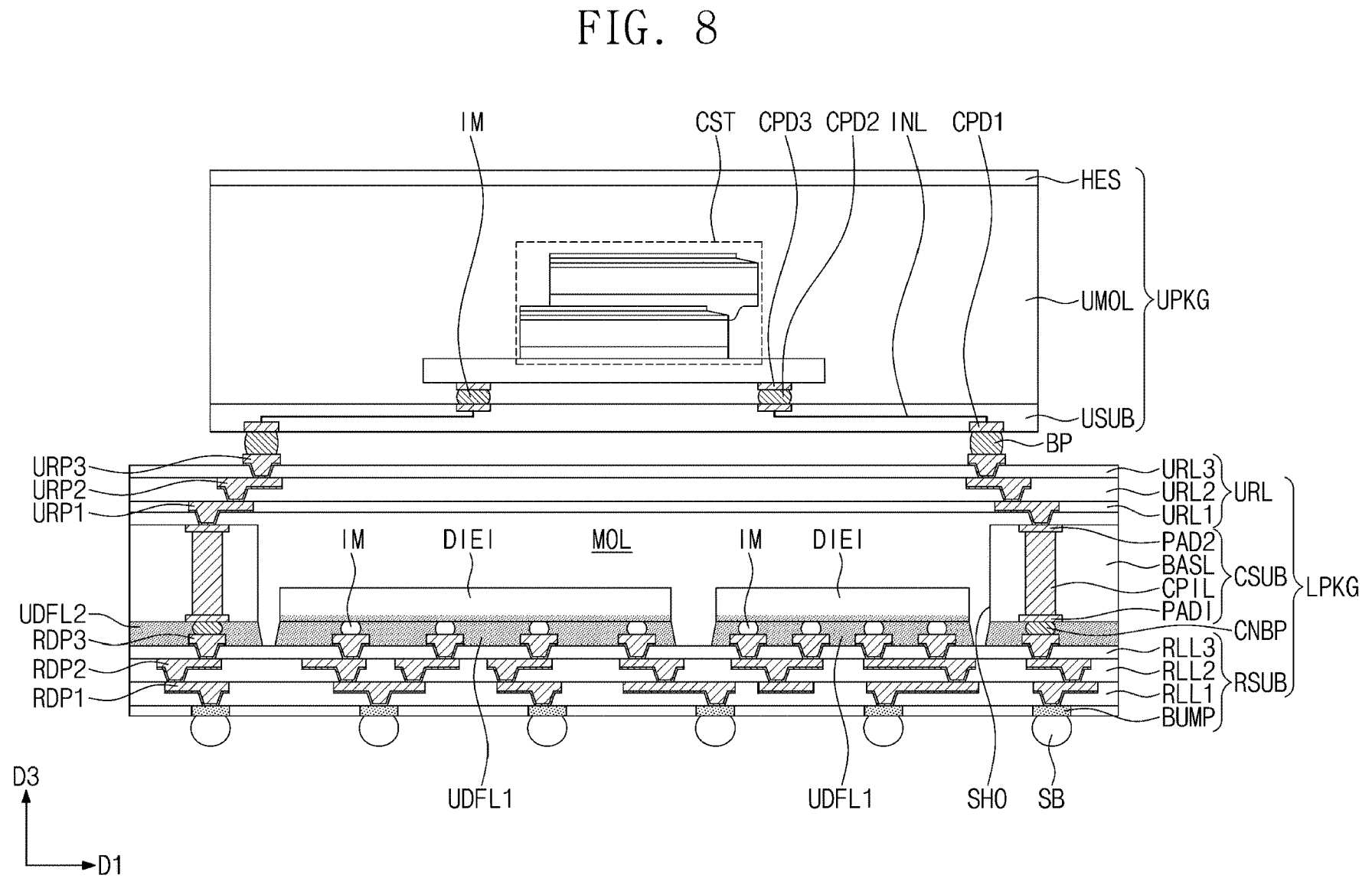

FIGS. 7 and 8 are cross-sectional views illustrating a semiconductor package according to embodiments of the inventive concept.

Referring to FIG. 7, a semiconductor package according to the present embodiment may include a lower semiconductor package LPKG and an upper semiconductor package UPKG. The lower semiconductor package LPKG may include a redistribution substrate RSUB, second external terminals SB, connection terminals IM, a first die DIE1, a molding pattern MOL, conductive pillars CPIL, and an upper redistribution layer URL.

The redistribution substrate RSUB may include a first redistribution layer RLL1, a second redistribution layer RLL2, and a third redistribution layer RLL3 that are sequentially stacked. The first redistribution layer RLL1 may include first redistribution patterns RDP1. The second redistribution layer RLL2 may include second redistribution patterns RDP2. The third redistribution layer RLL3 may include lower bonding pads RDP3. An upper portion of each of the lower bonding pads RDP3 may protrude above the third redistribution layer RLL3. Each of the first redistribution patterns RDP1, the second redistribution patterns RDP2, and the lower bonding pads RDP3 may include a seed pattern and a conductive pattern thereon.

A plurality of bump patterns BUMP may be provided under the first redistribution layer RLL1. The bump patterns BUMP may be respectively connected to the first redistribution patterns RDP1. A plurality of second external terminals SB may be provided under the bump patterns BUMP, respectively. The bump pattern BUMP may be interposed between the second external terminal SB and the first redistribution pattern RDP1 to connect the second external terminal SB and the first redistribution pattern RDP1. For example, the second external terminal SB may be a solder ball.

The first die DIE1 may be provided on the redistribution substrate RSUB. The first die DIE1 may be provided on at least one redistribution substrate RSUB. The first dies DIE1 may be mounted side by side in a first direction D1 on the redistribution substrate RSUB. The first die DIE1 may be a semiconductor chip. For example, the first die DIE1 may include one of a logic chip, a memory chip, and a power management chip.

Unlike the drawings, the first die DIE1 may be omitted. As another example, an additional die (i.e., a semiconductor chip) may be mounted on the redistribution substrate RSUB.

The connection terminals IM may be respectively interposed between the first dies DIE1 and the lower bonding pads RDP3 of the redistribution substrate RSUB. The first die DIE1 and the redistribution substrate RSUB may be electrically connected to each other through the connection terminals IM. For example, the connection terminals IM may include micro bumps.

At least one conductive pillar CPIL may be provided on the redistribution substrate RSUB. The conductive pillar CPIL may be provided on an edge region of the redistribution substrate RSUB. The conductive pillar CPIL may be horizontally spaced apart from the first dies DIE1.

The conductive pillar CPIL may be connected to a corresponding lower bonding pad RDP3. That is, the conductive pillar CPIL may be electrically connected to the redistribution substrate RSUB. For example, the conductive pillar CPIL may be electrically connected to the first die DIE1 or the second external terminals SB through the redistribution substrate RSUB. The conductive pillar CPIL may be a metal pillar including a metal such as copper.

The molding pattern MOL may be provided on the redistribution substrate RSUB to cover the first die DIEL. The molding pattern MOL may cover a sidewall of the conductive pillar CPIL. A sidewall of the molding pattern MOL may be aligned with a sidewall of the redistribution substrate RSUB. The molding pattern MOL may expose an upper surface of the conductive pillar CPIL. For example, the molding pattern MOL may include an insulating polymer such as an epoxy-based molding compound.

An upper redistribution layer URL may be provided on the upper surface of the molding pattern MOL. The upper redistribution layer URL may include a first upper redistribution layer URL1, a second upper redistribution layer URL2, and a third upper redistribution layer URL3.

The first upper redistribution layer URL1 may include first upper redistribution patterns URP1. The second upper redistribution layer URL2 may include second upper redistribution patterns URP2. The third upper redistribution layer URL3 may include upper bonding pads URP3. The first upper redistribution pattern URP1 may be connected to the upper surface of the conductive pillar CPIL. An upper portion of each of the upper bonding pads URP3 may protrude above the third upper redistribution layer URL3. Each of the first upper redistribution patterns URP1, the second upper redistribution patterns URP2, and the upper bonding pads URP3 may include a seed pattern and a conductive pattern thereon.

The upper bonding pads URP3 may be electrically connected to the first die DIE1 or the second external terminals SB through the first and second upper redistribution patterns URP1 and URP2 and the conductive pillars CPIL. As the first and second upper redistribution patterns URP1 and URP2 are provided, the upper bonding pad URP3 may be disposed to be offset from the conductive pillar CPIL.

The upper semiconductor package UPKG may be provided on the lower semiconductor package LPKG. For example, the upper semiconductor package UPKG may be mounted on the upper redistribution layer URL. The upper semiconductor package UPKG may include an upper substrate USUB, a multi-chip structure CST according to an embodiment of the inventive concept, and an upper molding pattern UMOL. For example, the upper substrate USUB may be a printed circuit board. As another example, the upper substrate USUB may be a redistribution substrate such as the redistribution substrate RSUB of the lower semiconductor package LPKG.

A first conductive pad CPD1 and a second conductive pad CPD2 may be respectively disposed on a lower surface and an upper surface of the upper substrate USUB. A wiring INL may be provided in the upper substrate USUB to connect to the first conductive pad CPD1 and the second conductive pad CPD2. The wiring INL is schematically illustrated, and the shape and arrangement of the wiring INL may be variously modified. The first conductive pad CPD1, the second conductive pad CPD2, and the wiring INL may include a conductive material such as a metal.

The multi-chip structure CST may be disposed on the upper substrate USUB. The multi-chip structure CST may include an integrated circuit (not shown), and the integrated circuit may include a memory circuit, a logic circuit, or a combination thereof. The multi-chip structure CST may be a semiconductor chip of a different type from that of the first die DIE1. For example, the multi-chip structure CST may be a plurality of memory chips. A connection terminal IM may be interposed between the second conductive pad CPD2 and the multi-chip structure CST to connect the upper substrate USUB and the multi-chip structure CST to each other. The multi-chip structure CST may be electrically connected to the first conductive pad CPD1 through the connection terminal IM and the wiring INL.

The upper molding pattern UMOL may be provided on the upper substrate USUB to cover the multi-chip structure CST. The upper molding pattern UMOL may include an insulating polymer such as an epoxy-based polymer.

The upper semiconductor package UPKG may further include a heat dissipation structure HES. The heat dissipation structure HES may include a heat sink, a heat slug, or a layer of heat transfer material. For example, the heat dissipation structure HES may include a metal. The heat dissipation structure HES may be disposed on an upper surface of the upper molding pattern UMOL. The heat dissipation structure HES may further extend on a sidewall of the upper molding pattern UMOL.

First external terminals BP may be provided between the lower semiconductor package LPKG and the upper semiconductor package UPKG. The first external terminal BP may be interposed between the upper bonding pad URP3 and the first conductive pad CPD1 to connect the lower semiconductor package LPKG and the upper semiconductor package UPKG to each other. For example, the upper semiconductor package UPKG may be electrically connected to the first die DIE1 or the second external terminals SB through the first external terminals BP. An electrical connection of the upper semiconductor package UPKG may mean an electrical connection with the integrated circuit in the multi-chip structure CST. The first external terminal BP may include solder, a bump, or a combination thereof. The first external terminal BP may include a solder material.

Referring to FIG. 8, a semiconductor package according to the present embodiment may include a lower semiconductor package LPKG and an upper semiconductor package UPKG. The lower semiconductor package LPKG may include a redistribution substrate RSUB, second external terminals SB, connection terminals IM, connection bump CNBP, first die DIE1, molding pattern MOL, and a connection substrate CSUB. The redistribution substrate RSUB, the second external terminals SB, the connection terminals IM, and the molding pattern MOL may be the same as or similar to those described with reference to FIG. 7.

The lower semiconductor package LPKG may further include a first underfill layer UDFL1. The first underfill layer UDFL1 may be provided in a first gap region between the redistribution substrate RSUB and the first die DIE1. The first underfill layer UDFL1 may seal the connection terminals IM.

The connection substrate CSUB may be disposed on the redistribution substrate RSUB. The connection substrate CSUB may have a substrate hole SHO passing therethrough. For example, the connection substrate CSUB may be manufactured by forming the substrate hole SHO passing through upper and lower surfaces of the connection substrate CSUB. In a plan view, the substrate hole SHO may overlap a center portion of the redistribution substrate RSUB. The first die DIE1 may be disposed in the substrate hole SHO of the connection substrate CSUB. The first die DIE1 may be spaced apart from an inner wall of the connection substrate CSUB.

The connection substrate CSUB may include a base layer BASL and a conductive pillar CPIL. The base layer BASL may include a single layer or multiple layers. The base layer BASL may include an insulating material. For example, the base layer BASL may include a carbon-based material, a ceramic, or a polymer. The conductive pillar CPIL may be provided in the base layer BASL. The connection substrate CSUB may further include a first pad PAD1 and a second pad PAD2. The first pad PAD1 may be disposed on a lower surface of the conductive pillar CPIL. The second pad PAD2 may be disposed on an upper surface of the conductive pillar CPIL. The second pad PAD2 may be electrically connected to the first pad PAD1 through the conductive pillar CPIL. For example, each of the conductive pillar CPIL, the first pad PAD1, and the second pad PAD2 may include at least one selected from copper, aluminum, tungsten, titanium, tantalum, iron, and alloys thereof.

The connection bump CNBP may be disposed between the redistribution substrate RSUB and the connection substrate CSUB. The connection bump CNBP may be interposed between the first pad PAD1 and the corresponding lower bonding pad RDP3 to connect the connection substrate CSUB and the redistribution substrate RSUB to each other.

The conductive pillar CPIL may be electrically connected to the redistribution substrate RSUB by the connection bump CNBP. The connection bump CNBP may include at least one of a solder ball, a bump, and a pillar. The connection bump CNBP may include a metal material.

A second underfill layer UDFL2 may be interposed between the redistribution substrate RSUB and the connection substrate CSUB to seal the connection bump CNBP. The second underfill layer UDFL2 may include an insulating polymer.

A molding pattern MOL may be provided on the connection substrate CSUB. The molding pattern MOL may cover the first die DIE1 while filling the substrate hole SHO. The molding pattern MOL may be interposed between the first die DIE1 and the first die DIE1 and between the first die DIE1 and the connection substrate CSUB.

In an embodiment, an adhesive insulating film may be attached to an upper surface of the connection substrate CSUB, upper surfaces of the first die DIE1, and sidewalls of the first die DIE1 to form the molding pattern MOL. For example, Ajinomoto Build Up Film (ABF) may be used as the adhesive insulating film. As another example, the molding pattern MOL may include an insulating polymer such as an epoxy-based polymer. As another example, the first underfill layers UDFL1 may be omitted, and the molding pattern MOL may further extend on the lower surface of the first die DIE1. When the second underfill layer UDFL2 is omitted, the molding pattern MOL may further extend into a gap between the redistribution substrate RSUB and the connection substrate CSUB.

The lower semiconductor package LPKG may further include an upper redistribution layer URL. The upper redistribution layer URL may be disposed on the molding pattern MOL and the connection substrate CSUB. The upper redistribution layer URL may be the same as or similar to the upper redistribution layer URL described above with reference to FIG. 7.

The upper semiconductor package UPKG may be provided on the lower semiconductor package LPKG. For example, the upper semiconductor package UPKG may be mounted on the upper redistribution layer URL. The upper semiconductor package UPKG may include an upper substrate USUB, a multi-chip structure CST, and an upper molding pattern UMOL. The upper semiconductor package UPKG and the first external terminal BP may be substantially the same as described above with reference to FIG. 7. For example, the first external terminal BP may be interposed between the lower semiconductor package LPKG and the upper semiconductor package UPKG. The upper semiconductor package UPKG may further include a heat dissipation structure HES.

In the semiconductor package according to embodiments of the inventive concept, the sides of the lower chip stack may be capped (i.e., on and/or covered) by the adhesive layer of the upper chip stack and the underfill pattern, thereby protecting the lower chip stack from the external factors. That is, the lower chip stack may be protected from stresses (e.g., warpage stress) on the substrate and the upper chip stack, thereby improving the reliability and stability of the semiconductor package.

In addition, the lower and upper chip stacks may be arranged in the offset stacking structure, and thus the wires of the lower chip stack may not be inserted into the adhesive layer. Accordingly, the thickness of the adhesive layer may be reduced, and the thickness of the chip stacks may be reduced. That is, the semiconductor package may be miniaturized.

While embodiments are described above, a person skilled in the art may understand that many modifications and variations are made without departing from the scope of the inventive concept defined in the following claims. Accordingly, the example embodiments of the inventive concept should be considered in all respects as illustrative and not restrictive, with the scope of the inventive concept being indicated by the appended claims.

What is claimed is:

1. A semiconductor package comprising:
   a substrate;
   a first chip stack on the substrate and comprising a first semiconductor chip;
   an underfill pattern comprising opposite first and second sides, wherein the underfill pattern first side is on a first side of the first chip stack; and
   a second chip stack on the first chip stack and comprising a second semiconductor chip,
   wherein the second chip stack is offset horizontally from the first chip stack,
   wherein the first chip stack comprises:
      a first adhesive layer under the first semiconductor chip; and
      a first chip protection structure on the first semiconductor chip,
   wherein the second chip stack comprises:
      a second adhesive layer under the second semiconductor chip; and
      a second chip protection structure on the second semiconductor chip,
      wherein the first semiconductor chip is interposed between the first adhesive layer and the first chip protection structure,
      wherein the second semiconductor chip is interposed between the second adhesive layer and the second chip protection structure,
   wherein an extension portion of the second adhesive layer is on a first side of the first chip protection structure,
   wherein the second adhesive layer exposes a second side of the first chip protection structure, and
   wherein the underfill pattern extends from the first side of the first chip stack to the extension portion.

2. The semiconductor package of claim 1, wherein the second adhesive layer further comprises a film portion,
   wherein the film portion is on an upper surface of the first chip protection structure wherein the extension portion of the second adhesive layer extends toward the substrate from the film portion and is on the first side of the first chip protection structure.

3. The semiconductor package of claim 2, wherein an interface between the extension portion of the second adhesive layer and the underfill pattern has a curved surface.

4. The semiconductor package of claim 1, wherein the second side of the underfill pattern is inclined.

5. The semiconductor package of claim 1, wherein a distance from the first side of the first chip stack to the second side of the underfill pattern is smaller than a distance from the first side of the first chip stack to a first side of the second chip stack.

6. The semiconductor package of claim 1, wherein a distance from the first side of the first chip stack to the second side of the underfill pattern is the same as a distance from the first side of the first chip stack to a first side of the second chip stack.

7. The semiconductor package of claim 1, wherein the underfill pattern comprises an epoxy polymer, phenol, rubber, phenoxy acrylic polymer, colloidal silica, or a combination thereof.

8. The semiconductor package of claim 1, wherein the first chip protection structure comprises a first passivation layer, a second passivation layer, and a third passivation layer that are sequentially stacked on the first semiconductor chip, and wherein a first side of the second passivation layer between the first and third passivation layers is inclined relative to a first side of the first passivation layer and a first side of the third passivation layer.

9. The semiconductor package of claim 8, wherein the first passivation layer comprises silicon nitride, and wherein the second passivation layer comprises silicon oxide.

10. The semiconductor package of claim 1, wherein the first and second adhesive layers comprise a film-type solid phase.

11. The semiconductor package of claim 1, wherein the first and second adhesive layers comprise an epoxy-based polymer.

12. The semiconductor package of claim 1, wherein the first chip stack further comprises a first chip pad on a first connection region of the first chip protection structure, and a first connection wire extending from the first chip pad to the substrate, and wherein the second chip stack further comprises a second chip pad on a second connection region of the second chip protection structure, and a second connection wire extending from the second chip pad to the substrate.

13. A semiconductor package comprising:

a substrate;

a first chip stack on the substrate; and a second chip stack on the first chip stack and offset horizontally from the first chip stack, wherein the first chip stack comprises a first semiconductor chip on the substrate, a first chip protection structure on the first semiconductor chip, and a first adhesive layer under the first semiconductor chip, wherein the first semiconductor chip is interposed between the first adhesive layer and the first chip protection structure, wherein the second chip stack comprises a second semiconductor chip on the first chip stack, a second chip protection structure on the second semiconductor chip, and a second adhesive layer under the second semiconductor chip, wherein the second semiconductor chip is interposed between the second adhesive layer and the second chip protection structure, wherein the second adhesive layer comprises:

a first film portion extending in a first direction along the second semiconductor chip; and a first extension portion extending from the first film portion wherein the first extension portion is on a first side of the first chip protection structure, and the second adhesive layer exposes a second side of the first chip protection structure.

14. The semiconductor package of claim 13, wherein the first chip protection structure further comprises a first passivation layer, a second passivation layer, and a third passivation layer that are sequentially stacked on the first semiconductor chip, wherein respective first side surfaces of the first and third passivation layers are parallel to a second direction that is perpendicular to the first direction, wherein a first side surface of the second passivation layer is angled relative to the first side surface of the first passivation layer and the first side surface of the third passivation layer, and wherein the first side of the first chip protection structure comprises the first surfaces of the first, second, and third passivation layers.

15. The semiconductor package of claim 13, further comprising an underfill pattern adjacent to a first side of the first chip stack and a lower surface of the second chip stack, wherein the underfill pattern comprises a first side on the first side of the first chip protection structure and the first extension portion of the second adhesive layer.

16. The semiconductor package of claim 15, wherein the underfill pattern comprises an opposite second side that is inclined relative to the first side of the underfill pattern.

17. The semiconductor package of claim 13, wherein a third chip stack comprises a third semiconductor chip on the second chip stack, a third chip protection structure on the third semiconductor chip, and a third adhesive layer under the third semiconductor chip, wherein the third adhesive layer comprises:

a second film portion extending in the first direction along the third semiconductor chip; and a second extension extending from the second film portion, and wherein the first and second extension portions are symmetrical to each other.

18. A semiconductor package comprising:

a first chip stack on a substrate, the first chip stack comprising a first semiconductor chip, a first chip protection structure on the first semiconductor chip, a first adhesive layer under the first semiconductor chip, a first chip pad on a first connection region of the first chip protection structure, and a first wire extending from the first chip pad to the substrate;

a second chip stack comprising a second semiconductor chip on the first chip stack and offset from the first chip stack, a second chip protection structure on the second semiconductor chip, a second adhesive layer under the second semiconductor chip, a second chip pad on a second connection region of the second chip protection structure, and a second wire extending from the second chip pad to the substrate;

a plurality of signal pads on the substrate and spaced apart from the first chip stack, a first one of the plurality of signal pads connected to the first wire, and a second one of the plurality of signal pads connected to the second wire;

an underfill pattern adjacent to a first side of the first chip protection structure, the underfill pattern overlapping the second chip stack; and a molding layer on the first and second chip stacks, the plurality of signal pads, and the underfill pattern, wherein the first semiconductor chip is interposed between the first adhesive layer and the first chip protection structure, wherein the second semiconductor chip is interposed between the second adhesive layer and the second chip protection structure, wherein the second adhesive layer exposes a second side of the first chip protection structure, wherein the underfill pattern comprises a first side that is on a first side of the first semiconductor chip, a first side of the first adhesive layer, and an extension portion of the second adhesive layer.

19. The semiconductor package of claim 18, wherein the underfill pattern comprises an opposite second side that is inclined relative to the first side of the underfill pattern.

20. The semiconductor package of claim 18, wherein an interface between the extension portion of the second adhesive layer and the underfill pattern has a curved surface.

*   *   *   *   *